(12) United States Patent
Hill

(10) Patent No.: US 7,112,977 B2
(45) Date of Patent: Sep. 26, 2006

(54) CONSTRUCTION AND USE OF DIELECTRIC PLATE FOR MATING TEST EQUIPMENT TO A LOAD BOARD OF A CIRCUIT TESTER

(75) Inventor: Gregory S. Hill, Santa Rosa, CA (US)

(73) Assignee: Verigy IPco, Singapore (SG)

( * ) Notice: Subject to any disclaimer, the term of this patent is extended or adjusted under 35 U.S.C. 154(b) by 49 days.

(21) Appl. No.: 10/925,466

(22) Filed: Aug. 25, 2004

(65) Prior Publication Data

US 2006/0043996 A1    Mar. 2, 2006

(51) Int. Cl.
 *G01R 31/02* (2006.01)
 *G01R 31/28* (2006.01)
(52) U.S. Cl. ...................................... 324/763
(58) Field of Classification Search ............... None
 See application file for complete search history.

(56) References Cited

U.S. PATENT DOCUMENTS 5,642,055 A * 6/1997 Difrancesco ................ 324/757
7,023,227 B1 * 4/2006 Wong ......................... 324/760

* cited by examiner

*Primary Examiner*—Jermele Hollington
*Assistant Examiner*—Trung Q. Nguyen

(57) ABSTRACT

An article of manufacture may include a dielectric having a top surface and a bottom surface. The top surface provides a planar surface corresponding to a mating surface of test equipment. The bottom surface has a relief pattern that is formed to straddle components extending above a surface of a load board for a circuit tester. Also disclosed are methods and apparatus that use this and other dielectric plates to mate test equipment to a load board of a circuit tester.

14 Claims, 4 Drawing Sheets

```
┌─────────────────────────────────────────────────┐
│  MATE A DIELECTRIC PLATE TO AN EXTERIOR SURFACE │
│  OF A CIRCUIT TESTER LOAD BOARD, THE DIELECTRIC │──800
│  PLATE HAVING 1) A CUTOUT CORRESPONDING TO A DUT│
│     CONTACTOR OF THE LOAD BOARD, AND 2) AN      │
│   UNDERSIDE RELIEF PATTERN TO STRADDLE          │
│   COMPONENTS OF THE LOAD BOARD THAT EXTEND      │
│   ABOVE AN EXTERIOR SURFACE OF THE LOAD BOARD   │
└─────────────────────────────────────────────────┘
                        │
                        ▼
┌─────────────────────────────────────────────────┐
│  DOCK A TEST EQUIPMENT INTERFACE TO A SURFACE OF│──802
│  THE DIELECTRIC PLATE OPPOSITE THE LOAD BOARD   │
└─────────────────────────────────────────────────┘
```

FIG. 8

CONSTRUCTION AND USE OF DIELECTRIC PLATE FOR MATING TEST EQUIPMENT TO A LOAD BOARD OF A CIRCUIT TESTER

BACKGROUND

In automated test systems, a "load board" often provides an electrical and mechanical interface between a circuit tester of the test system and a device under test (DUT). The load board usually takes the form of a printed circuit board having one or more DUT contactors and impedance matching circuits thereon. The contactor(s) serve to mechanically hold (and provide electrical connections to) a number of DUTs, while the impedance matching circuit(s) serve to electrically couple DUT(s) held by the contactors to circuitry of the circuit tester.

At times, test equipment such as an automated DUT handler or environmental control system needs to mate to the load board of an automated test system. In the past, this has been dealt with by requiring the exterior surface of the load board to be free of obstructions. This, in turn, has forced load board designers to confine bias and impedance matching circuit(s) of the load board to the underside of the load board. However, placement of impedance matching circuit(s) on the underside of a load board can introduce a variety of design hurdles, such as: 1) signal routes may be longer, thereby increasing the likelihood of signal delay, signal skew, and signal noise; 2) vias through the load board are needed, thereby causing signals to bend at right angles and likely introducing signal reflections (not to mention that vias are typically less desirable interconnects than signal traces; and 3) termination impedances cannot be placed as close to a DUT.

SUMMARY OF THE INVENTION

In one embodiment, an article of manufacture comprises a dielectric having a top surface and a bottom surface. The top surface provides a planar surface corresponding to a mating surface of test equipment. The bottom surface has a relief pattern that is formed to straddle components extending above a surface of a load board for a circuit tester.

In one embodiment, a system comprises a circuit tester, a load board, and a dielectric plate. The load board comprises 1) a DUT contactor, and 2) an interface to electrically couple a DUT inserted in the contactor to the circuit tester. The dielectric plate is mated to the load board and has a cutout corresponding to the DUT contactor, as well as an underside relief pattern to straddle components of the load board interface that extend above an exterior surface of the load board.

In yet another embodiment, a method comprises mating a dielectric plate to an exterior surface of a circuit tester load board. The dielectric plate has 1) a cutout corresponding to a DUT contactor of the load board, and 2) an underside relief pattern to straddle components of the load board that extend above an exterior surface of the load board. The method then continues with the docking of a test equipment interface to a surface of the dielectric plate opposite the load board.

Other embodiments are also disclosed.

BRIEF DESCRIPTION OF THE DRAWINGS

Illustrative and presently preferred embodiments of the invention are illustrated in the drawings, in which:

FIG. 8 illustrates a method of using the dielectric plate shown in FIGS. 4–7.

DETAILED DESCRIPTION OF AN EMBODIMENT

Figure 1:
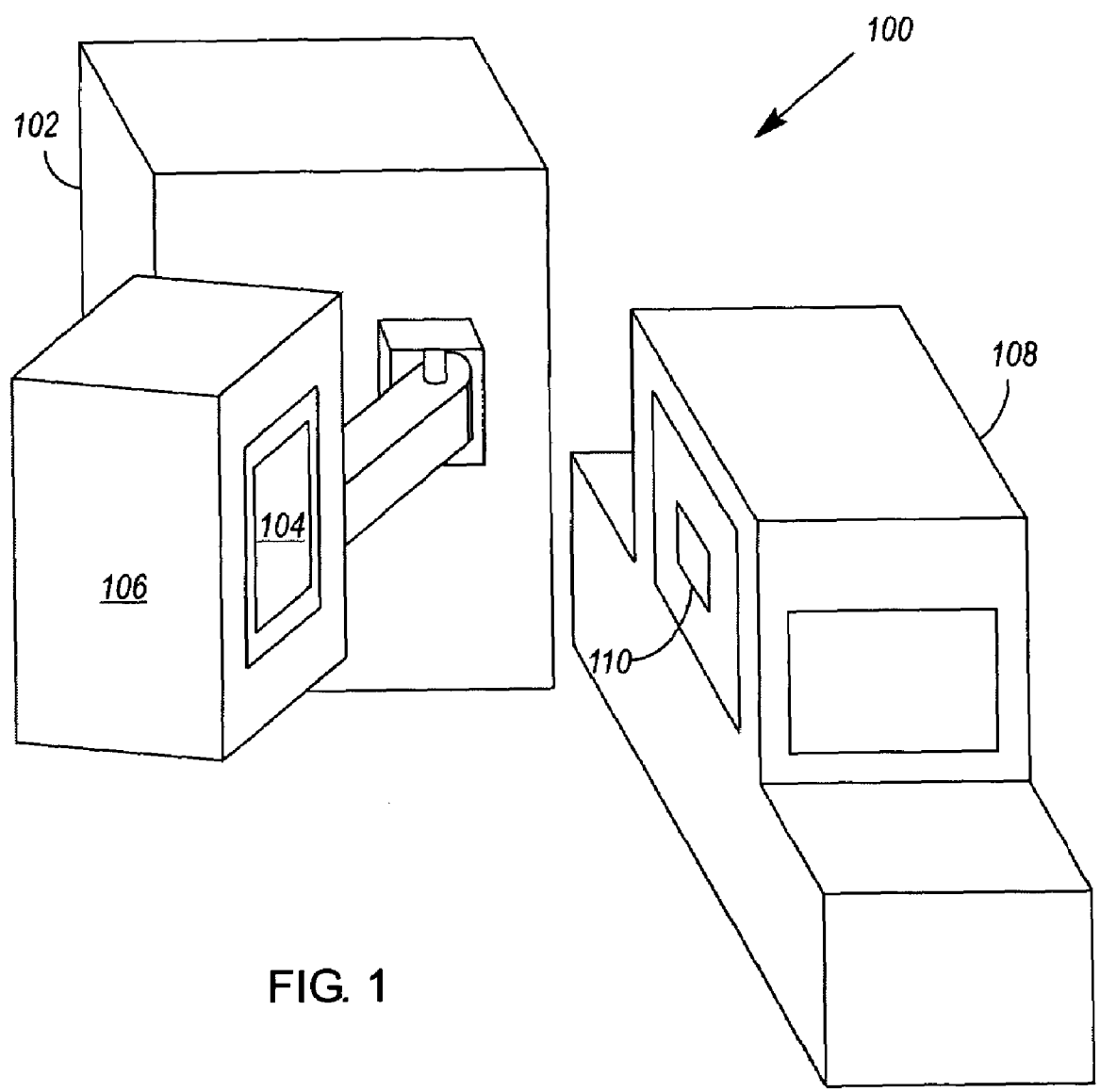
FIG. 1 illustrates a first exemplary automated test system, comprised of a circuit tester and a DUT handler.
Figure 2:
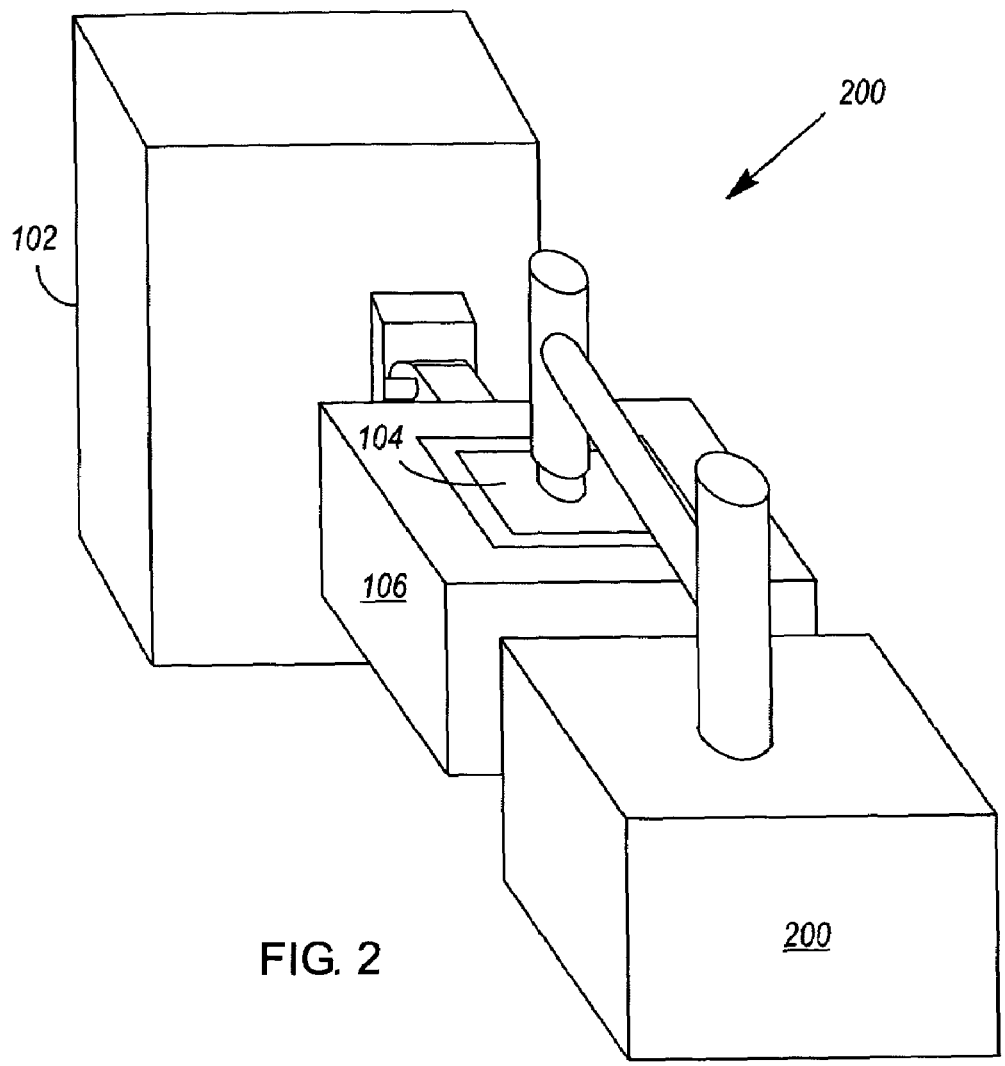
FIG. 2 illustrates a second exemplary automated test system, comprised of a circuit tester and an environmental control system.

FIGS. 1 & 2 illustrate automated test systems 100, 200 comprising a circuit tester 102. By way of example, the circuit tester 102 may take the form of a system-on-a-chip (SOC) tester, such as the Agilent 93000™ SOC tester available from Agilent Technologies, Inc. of Palo Alto, Calif., USA.

Coupled to each circuit tester 102 is a load board 104 for receiving one or more DUTs. The functions of each load board 104 are to 1) faithfully extend the resources of the circuit tester 102 to DUTs inserted in the load board 104, and 2) accurately reproduce any bias and impedance matching circuits required by the DUTs. If the circuit tester 102 is the afore-mentioned Agilent 93000 SOC tester, the tester's load board 104 may be carried by an articulated test head 106 that can assume either of the positions shown in FIGS. 1 & 2 (as well as other positions).

At times, an automated test system may comprise equipment that needs to dock with a circuit tester's load board 104. In FIG. 1, this equipment is shown to be a DUT handler 108 that automatically inserts and removes DUTs in/from the load board 104. To better show the docking interface 110 of the DUT handler 108, as well as the load board 104 of the circuit tester 102, FIG. 1 shows the circuit tester 102 and DUT handler 108 in an undocked configuration.

FIG. 2 shows how an environmental control system 200 might dock with the circuit tester 102. By way of example, the environmental control system may regulate the temperature and/or humidity of the environment in which a device is tested. To do this, however, the environmental control system 200 needs to be able to form a hermetic seal about the device (and possibly some portion of its environment). Note, in some cases, the DUT handler 108 itself may provide environmental controls.

Other types of equipment may also dock with a circuit tester 102 and, in some cases, an arm or extension of the circuit tester 102 itself may dock with the circuit tester's load board 104.

Figure 3:
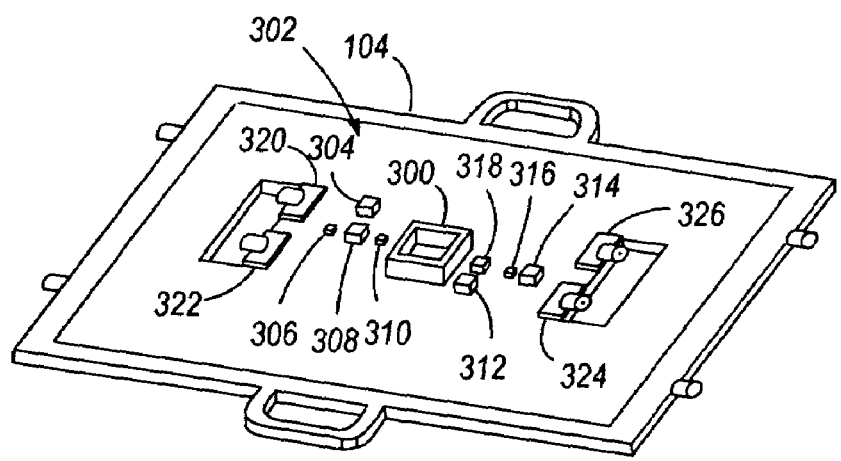
FIG. 3 illustrates an exemplary embodiment of the load boards shown in FIGS. 1 & 2.
Figure 4:
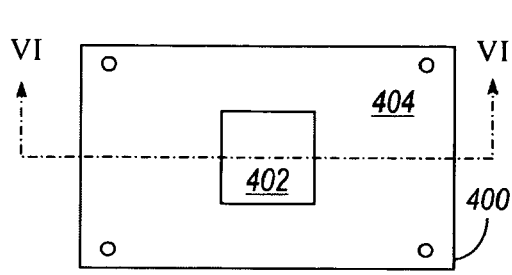
FIG. 4 illustrates a top plan view of an exemplary dielectric plate that interfaces with the load board shown in FIG. 3.
Figure 5:
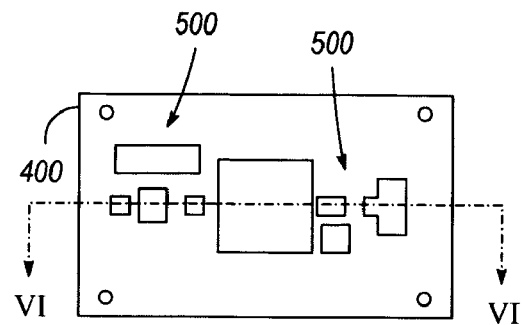
FIG. 5 illustrates a bottom plan view of the dielectric plate shown in FIG. 4.

As shown in FIG. 3, the load board 104 may comprise a DUT contactor 300, as well as an interface 302 to electrically couple a DUT inserted in the contactor 300 to the circuit tester 102. By way of example, the DUT contactor 300 is shown to be an integrated circuit (IC) socket. However, the DUT contactor could also take other forms, such as that of an edge connector. The load board 104 could also be provided with more than one DUT contactor.

The components 304, 306, 308, 310, 312, 314, 316, 318 of the load board interface 302 typically comprise those components that are needed to implement the bias and impedance matching circuits required by a DUT (or DUTs)

held by the contactors 300 of the load board 104. The components 304–318 of the load board 104 may variously comprise resistors, capacitors, inductors, hybrid circuits, power splitters, signal mixers, or other components. Some of these components 304–318 may extend beyond the surface of the load board 104. The load board 104 may also comprise electrical and mechanical connectors 320, 322, 324, 326 that extend beyond the surface of the load board 104.

In the past, the components 304–318 of a load board interface 302 have been largely confined to the underside of the load board 104, thereby providing an exterior docking surface that is free of obstructions. However, placement of impedance matching circuit(s) on the underside of a load board 104 can introduce a variety of design hurdles, such as: 1) signal routes may be longer, thereby increasing the likelihood of signal delay, signal skew, and signal noise; 2) vias through the load board 104 are needed, thereby causing signals to bend at right angles and likely introducing signal reflections (not to mention that vias are typically less desirable interconnects than signal traces; and 3) termination impedances cannot be placed as close to a DUT.

In the load board 104 shown in FIG. 3, components 304–318 of the load board interface 302, and perhaps the entire load board interface 302, are attached to the exterior surface of the load board 104. FIGS. 4–7 illustrate a means for docking test equipment 108, 200 to such a load board 104. The means comprises a dielectric plate 400 having 1) one or more cutouts 402 corresponding to the DUT contactors 300 of the load board 104, and 2) an underside relief pattern 500 to straddle components 304–318 of the load board interface 302 that extend above an exterior surface of the load board 104. The relief pattern 500 may be variously cut to bridge ones, groups, or even all of the components 304–318 extending above the exterior surface of the load board 104. In some cases, depths of the dielectric plate's relief pattern 500 may vary to substantially correspond to the heights of components 304–318 of the load board interface 302.

The dielectric plate 400 may be formed from various materials. One suitable material is a crystalline thermoplastic polymer, such as Delrin® acetal plastic. Delrin acetal plastic has a high melting point, a high modulus of elasticity, great strength, stiffness and resistance to abrasion. Furthermore, moisture has little to no effect on Delrin, and because of this, the dimensional stability of items fabricated with close tolerances is excellent.

Figure 6:
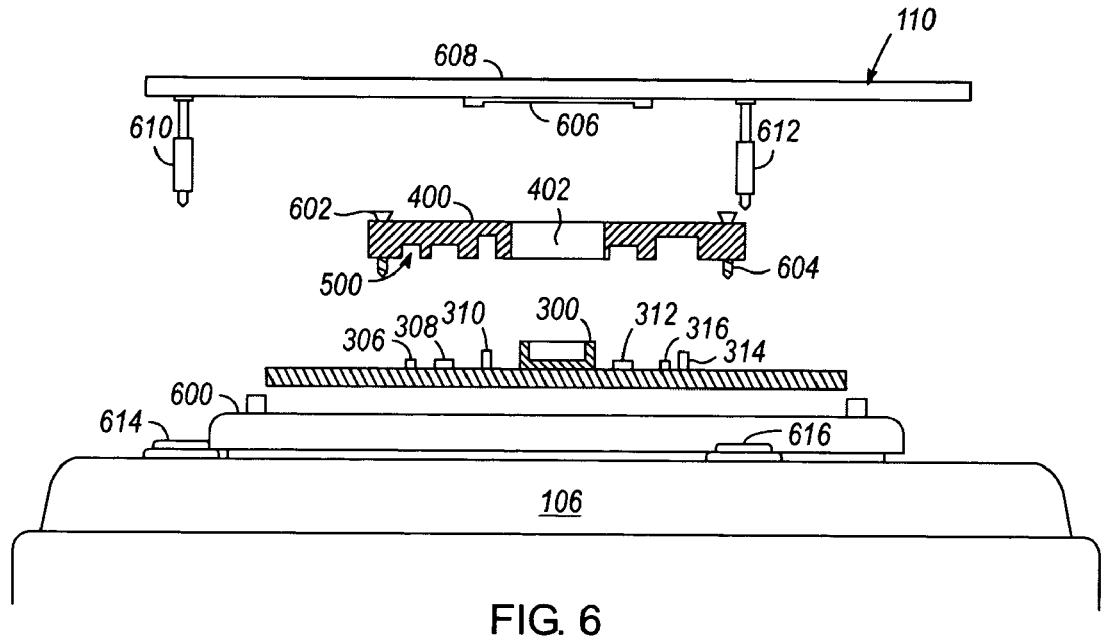
FIGS. 6 & 7 illustrate an exemplary use of the dielectric plate shown in FIGS. 4 & 5.
Figure 7:
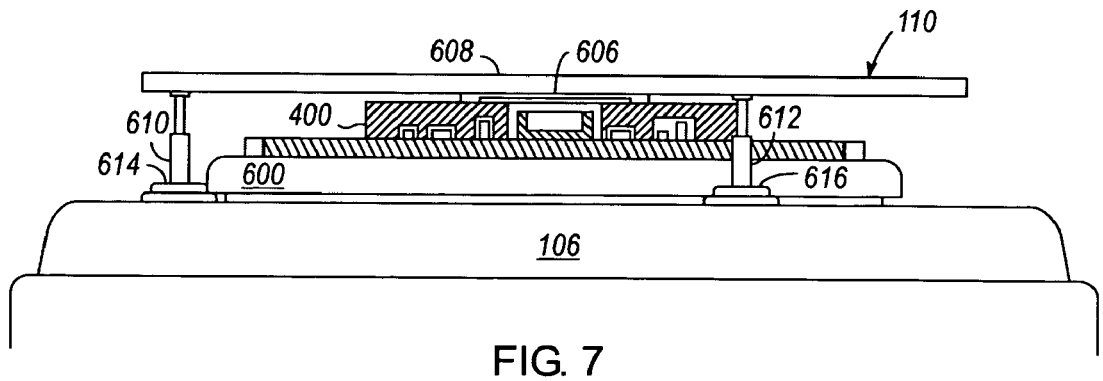

The dielectric plate 400 is used as shown in FIGS. 6–8. First, the load board 104 may be attached to a mounting plate 600 of the test head 106. Next, the dielectric plate 400 may be mated 800 (FIG. 8) to the exterior surface of the load board 104. In one embodiment, the dielectric plate 400 is removably secured to the load board 104 using a number of flathead screws 602, 604. A test equipment interface 110 is then docked 802 to a surface 404 of the dielectric plate 400 opposite the load board 104. As shown in FIGS. 6 & 7, the test equipment interface 110 may take the form of first and second tiered docking plates 606, 608. The first of the docking plates 606 may dock with the dielectric plate 400, about the DUT contactors 300 on the load board 104. Preferably, this first docking plate 606 forms a hermetic seal with the dielectric plate 400, although it need not. To form the seal, both the docking plate 606 and the dielectric plate 400 may have planar surfaces. However, it is also anticipated that the docking plate 606 and dielectric plate 400 could have irregular, but corresponding, mating surfaces (with the surfaces even corresponding to a point where they may hermetically seal against one another). The second of the docking plates 608 may dock with the test head 106 of the circuit tester 102. As it moves toward the test head 106, pins 610, 612 in the second docking plate 608 may extend into corresponding receptacles 614, 616 in the test head 106 to thereby secure the test instrument interface 110 to the test head 106 (and thereby secure the docking plate 606 to the load board 104).

What is claimed is:

1. A system, comprising:
    a circuit tester;
    a load board comprising i) a DUT contactor, and ii) an interface to electrically couple a DUT inserted in the contactor to the circuit tester; and
    a dielectric plate, mated to the load board, having i) a cutout corresponding to said DUT contactor, and ii) an underside relief pattern to straddle components of the load board interface that extend above an exterior surface of the load board.

2. The system of claim 1, wherein the circuit tester is a system-on-a-chip tester.

3. The system of claim 1, wherein the DUT contactor comprises a socket.

4. The system of claim 1, wherein the load board interface comprises an impedance matching circuit.

5. The system of claim 1, wherein the components of the load board interface comprise at least one of: a resistor, a capacitor, an inductor, a hybrid circuit, a power splitter, and a signal mixer.

6. The system of claim 1, wherein a top surface of the dielectric plate, opposite its underside relief pattern, provides a planar mating surface for test equipment.

7. The system of claim 1, wherein depths of the dielectric plate's underside relief pattern vary to substantially correspond to the heights of components of the load board interface.

8. The system of claim 7, wherein a top surface of the dielectric plate, opposite its underside relief pattern, provides a planar mating surface for test equipment.

9. The system of claim 8, wherein the dielectric plate comprises a crystalline thermoplastic polymer.

10. The system of claim 8, wherein the dielectric plate comprises a Delrin® acetal plastic.

11. The system of claim 8, further comprising a number of flathead screws that removably secure the dielectric plate to the load board.

12. The system of claim 1, wherein the dielectric plate comprises a crystalline thermoplastic polymer.

13. The system of claim 1, wherein the dielectric plate comprises a Delrin® acetal plastic.

14. The system of claim 1, further comprising a number of flathead screws that removably secure the dielectric plate to the load board.

* * * * *